(12) United States Patent
Choppalli et al.

(10) Patent No.: US 9,472,609 B2
(45) Date of Patent: Oct. 18, 2016

(54) METHODS OF MANUFACTURING POLYRESISTORS WITH SELECTED TCR

(71) Applicant: International Business Machines Corporation, Armonk, NY (US)

(72) Inventors: Satyasuresh V. Choppalli, Bangalore (IN); Prabhu R. Dattatreya, Bangalore (IN); Josef S. Watts, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/834,692

(22) Filed: Aug. 25, 2015

(65) Prior Publication Data

US 2015/0364533 A1 Dec. 17, 2015

Related U.S. Application Data

(62) Division of application No. 14/219,317, filed on Mar. 19, 2014.

(51) Int. Cl.
*G06F 17/50* (2006.01)
*H01L 49/02* (2006.01)
(Continued)

(52) U.S. Cl.
CPC ......... *H01L 28/20* (2013.01); *H01L 21/02532* (2013.01); *H01L 21/02595* (2013.01); *H01L 22/14* (2013.01); *H01L 22/20* (2013.01)

(58) Field of Classification Search
CPC . H01L 28/20; H01L 22/20; H01L 21/02532; H01L 21/02595; H01L 22/14
USPC .......................................................... 716/54
See application file for complete search history.

(56) References Cited

U.S. PATENT DOCUMENTS 4,467,519 A * 8/1984 Glang ............... H01L 21/32155
257/517
5,793,097 A * 8/1998 Shimamoto ......... H01L 27/0652
257/381

(Continued)

FOREIGN PATENT DOCUMENTS

WO 2004097860 A1 11/2004

OTHER PUBLICATIONS

Feldbaumer et al., "Pulse Current Trimming of Polysilicon Resistors", IEEE Transactions on Electron Devices, vol. 42, No. 4, Apr. 1995.

(Continued)

*Primary Examiner* — Jack Chiang
*Assistant Examiner* — Brandon Bowers
(74) *Attorney, Agent, or Firm* — Steven Meyers; Hoffman Warnick LLC

(57) ABSTRACT

Various embodiments provide computer program products and computer implemented methods. In some embodiments, aspects provide for a method of manufacturing a polysilicon resistor with a selected temperature coefficient of resistance (TCR), the method including selecting a sheet resistance for the polysilicon resistor, the selected sheet resistance being related to a selected film thickness of the polysilicon resistor, selecting a dose level for a grain size modulating species (GSMS) for modulating an average grain size of grains of the polysilicon resistor, selecting a thermal coefficient of resistance (TCR) for the polysilicon resistor, the TCR being related to a selected average grain size of the polysilicon and forming the polysilicon resistor on a substrate, the polysilicon resistor having the selected sheet resistance, the selected GSMS dose level and the selected TCR.

5 Claims, 6 Drawing Sheets

(51) Int. Cl.
 *H01L 21/66* (2006.01)
 *H01L 21/02* (2006.01)

(56) References Cited

U.S. PATENT DOCUMENTS

| | | |
|---|---|---|
| 6,682,992 B2 | 1/2004 | Geiss et al. |
| 7,555,829 B2 | 7/2009 | Grudin et al. |
| 7,667,156 B2 | 2/2010 | Grudin et al. |
| 7,703,051 B2 | 4/2010 | Grudin et al. |
| 7,714,694 B2 | 5/2010 | Landsberger et al. |
| 7,777,302 B2 * | 8/2010 | Geiss ............... H01L 21/26506 257/565 |

OTHER PUBLICATIONS

Office Action for U.S. Appl. No. 14/219,317, dated Jan. 4, 2016, 12 pages.
Office Action for U.S. Appl. No. 14/219,317, dated May 12, 2016, 18 pages.

* cited by examiner

METHODS OF MANUFACTURING POLYRESISTORS WITH SELECTED TCR

FIELD

The subject matter disclosed herein relates generally to resistors. More particularly, the subject matter disclosed relates to measuring the temperature coefficient of resistance (TCR) for resistors and methods of manufacturing resistors with a controlled thermal coefficient of resistance.

BACKGROUND

In general, polysilicon resistors are created to have a specific sheet resistance or a range of sheet resistances. Currently, polysilicon resistors and resistors of other materials are created using manufacturing processes that target a given sheet resistance and therefore dope the polysilicon at targeted doping levels with suitable masks. Such manufacturing approaches do not generally control for the thermal behavior(s) of the resistors so manufactured and, therefore, resistors created using such methods generally exhibit greater or lesser resistance as ambient or operating temperature changes. Generally, this change in resistance due to temperature changes can be described by a thermal coefficient of resistance (TCR). A positive TCR indicates change in resistance and change in temperature being proportional to one another, while a negative TCR indicates inverse proportionality, i.e., a resistor that exhibits increased resistance when operating temperature rises has a positive TCR, and a resistor that exhibits lowered resistance as operating temperature rises has a negative TCR. Also, a resistor that does not exhibit changes in resistance due to changes in operating temperature has a zero TCR.

BRIEF DESCRIPTION

Various aspects of the invention provide for a method of manufacturing a polysilicon resistor with a selected temperature coefficient of resistance (TCR), the method including selecting a sheet resistance for the polysilicon resistor, the selected sheet resistance being related to a selected film thickness of the polysilicon resistor, selecting a dose level for a grain size modulating species (GSMS) for modulating an average grain size of grains of the polysilicon resistor, selecting a thermal coefficient of resistance (TCR) for the polysilicon resistor, the TCR being related to a selected average grain size of the polysilicon and forming the polysilicon resistor on a substrate, the polysilicon resistor having the selected sheet resistance, the selected GSMS dose level and the selected TCR.

A first aspect provides a method of manufacturing a polysilicon resistor with a selected temperature coefficient of resistance (TCR), the method comprising: selecting a sheet resistance for the polysilicon resistor, the selected sheet resistance being related to a selected film thickness of the polysilicon resistor; selecting a dose level for a grain size modulating species (GSMS) for modulating an average grain size of grains of the polysilicon resistor; selecting a thermal coefficient of resistance (TCR) for the polysilicon resistor, the TCR being related to a selected average grain size of the polysilicon; and forming the polysilicon resistor on a substrate, the polysilicon resistor having the selected sheet resistance, the selected GSMS dose level and the selected TCR.

A second aspect provides a computer-implemented method for calculating a temperature coefficient of resistance (TCR) for a polysilicon resistor on a substrate using at least one computing device, the method comprising: measuring a density of states (DOS) for traps within the polysilicon resistor using one of deep level transient spectroscopy (DLTS), the polysilicon resistor having a selected sheet resistance that is related to a selected polysilicon film thickness and a selected dose level for a grain size modulating species (GSMS) for modulating an average grain size of grains of the polysilicon resistor; creating a technology computer aided design (TCAD) model of the polysilicon resistor by performing a TCAD simulation on the polysilicon resistor; matching the TCAD model with a measured current versus voltage characteristic for the polysilicon resistor; calculating a resistance versus voltage characteristic based on the measured current versus voltage characteristic for the polysilicon resistor; converting the resistance versus voltage characteristic to a resistance versus temperature characteristic using the TCAD simulation model; and calculating the TCR for the polysilicon resistor using the resistance versus temperature characteristic.

A third aspect provides a computer program product comprising program code stored on a computer-readable storage medium, which when executed by at least one computing device, enables the at least one computing device to implement a method of calculating a temperature coefficient of resistance (TCR) for a polysilicon resistor by performing actions including: creating a technology computer aided design (TCAD) model of a polysilicon resistor by performing a TCAD simulation on the polysilicon resistor, wherein the polysilicon resistor has a selected sheet resistance that is related to a selected polysilicon film thickness and a selected dose level for a grain size modulating species (GSMS), the GSMS for modulating an average grain size of grains of the polysilicon resistor, wherein the polysilicon resistor has a measured current versus voltage characteristic, and wherein the polysilicon resistor has a measured density of states (DOS) for traps within the polysilicon resistor; matching the TCAD model with a measured current versus voltage characteristic for the polysilicon resistor; calculating a resistance versus voltage characteristic based on the measured current versus voltage characteristic for the polysilicon resistor; converting the resistance versus voltage characteristic to a resistance versus temperature characteristic using the TCAD simulation model; and calculating the TCR for the polysilicon resistor using the resistance versus temperature characteristic.

A fourth aspect provides a method of manufacturing a polysilicon resistor with a selected temperature coefficient of resistance (TCR), the method including: selecting a sheet resistance for the polysilicon resistor, the selected sheet resistance being related to a selected film thickness of the polysilicon resistor; selecting a dose level for a grain size modulating species (GSMS) for modulating an average grain size of grains of the polysilicon resistor after the selecting of the sheet resistance for the polysilicon resistor; selecting a thermal coefficient of resistance (TCR) for the polysilicon resistor, the TCR being related to a selected average grain size of the polysilicon after the selecting of the dose level for the GSMS; and forming the polysilicon resistor on a substrate, the polysilicon resistor having the selected sheet resistance, the selected GSMS dose level and the selected TCR after the selecting of the TCR for the polysilicon resistor.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
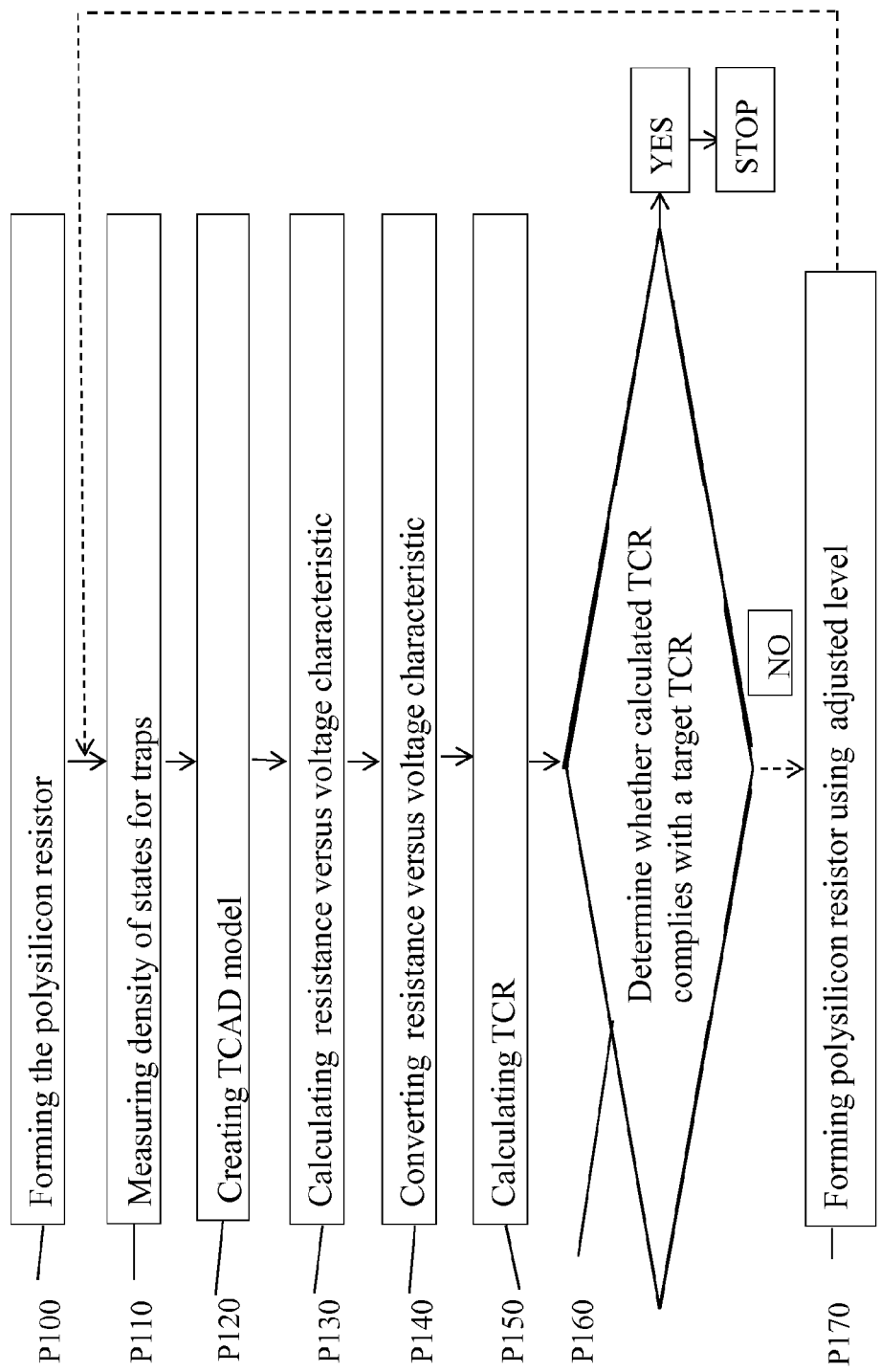
FIG. 1 shows a flow diagram illustrating a method according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates generally to resistors. More particularly, the subject matter disclosed relates to measuring the temperature coefficient of resistance (TCR) for resistors and methods of manufacturing resistors with a controlled thermal coefficient of resistance.

As discussed above, polysilicon resistors are generally created with a specific sheet resistance or a range of sheet resistances in mind and their methods of manufacture do not generally control for thermal behavior. For many applications, it may be problematic to use resistors created using such methods because ambient or operating temperature changes can cause the resistors to exhibit uncontrolled resistive properties.

Embodiments described herein include methods of measuring temperature coefficient of resistance (TCR) for polysilicon resistors and methods for the manufacture of polysilicon resistors with a desired TCR. While current manufacturing processes target a given sheet resistance by applying dopants with a suitable masks and do not control the thermal behavior of the polysilicon resistor, resistors made according to embodiments described herein exhibit controlled TCRs. According to embodiments, polysilicon resistors with fine-tuned, or even zero TCRs may be valuable devices for use in circuit design where thermal degradation (i.e., change in resistance) could negatively impact circuit behavior.

Under normal processing conditions polysilicon consists of many grains with variable sizes, mostly influenced by the process parameters including deposition process, anneal temperature and anneal duration. To date, grain-engineering has not been used in systematic applications for device design and development. Controlled grain growth, in itself, is a demanding and difficult-to-implement process. Embodiments described herein combine grain-control with a detailed TCAD simulation setup into methodologies that feed/supplement the technology development process to optimize the production of almost zero TCR polysilicon resistors for demanding analog applications. The ability to produce a zero TCR resistor or a combination of resistors with selected TCRs is of immense value to the design community, as this ability allows designers to achieve temperature-independent electrical behavior in designed devices. The TCAD method of calculating TCR is novel. However, when it comes to the manufacturing steps the TCR may be measured either via the novel TCAD method (as described herein) or via a plurality of experiments, although the TCAD method may be more feasible in terms of time and resources required. TCR values obtained by performing a first of the two methods may be validated by performing the second method to re-obtain those TCR values. During manufacturing processes, calculating the TCR may be performed either by adopting the above novel TCAD method or by performing a plurality of experiments. Applications for such TCR-controlled resistors include, but are not limited to current mirrors.

Turning now to FIG. 1, a flow diagram is shown illustrating processes that may be performed in a method according to various embodiments. FIG. 1 illustrates a method for calculating a temperature coefficient of resistance (TCR) for a polysilicon resistor. Process P100 includes forming the polysilicon resistor on a substrate, the polysilicon resistor having a selected sheet resistance that is related to a selected film thickness and a selected doping level for the polysilicon resistor. In general, such resistors are made on a wafer with standard materials, and of thicknesses that corresponds to appropriate sheet resistances, using standard doping methods. Such polysilicon resistors having selected sheet resistances may be created using any now known or later developed method or process. It should be noted that a polysilicon resistor having a selected sheet resistance may be simply acquired, and according to some embodiments, the actual creation of the resistor may not be necessary.

After creation of the polysilicon resistor in process P100, or the acquisition of a resistor having a selected sheet resistance, process P110 may be performed. Process P110 includes measuring a density state for traps within the polysilicon resistor using deep level transient spectroscopy (DLTS). It should be noted that DLTS is a suitable method to measure the density of states but one could measure resistances and TCR and simply tune the density of states (DOS) in the TCAD to match the resistances and TCR, and such tuning may be performed according to embodiments of the inventive concepts. It should be further noted that DLTS may be used to measure the depopulation of trap states as a transient capacitance response to a periodic injection of carriers as a function of injection frequency and temperature and from this density of states can be calculated and such processes may be performed according to embodiments.

Figure 3B:
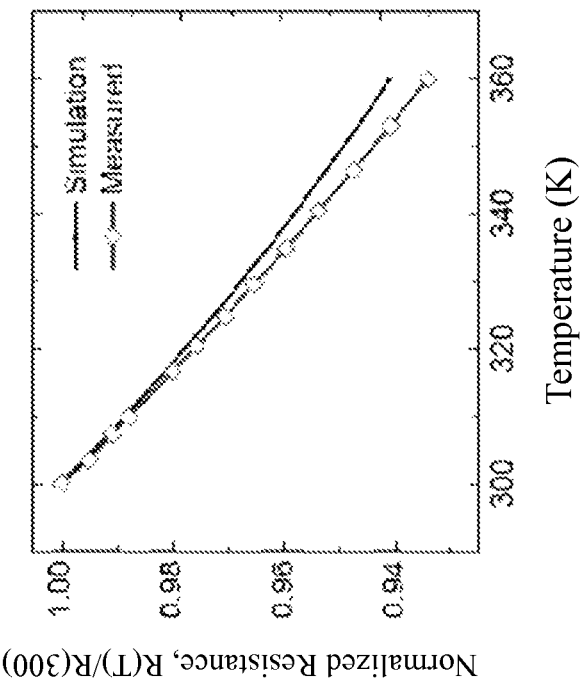
FIG. 3B shows a graph illustrating measured and simulated data according to embodiments.

Process P120 includes creating a technology computer aided design (TCAD) model of the polysilicon resistor by performing a TCAD simulation on the polysilicon resistor. TCAD analysis allows for the inputting of materials properties and parameters and dopant properties. Inputs into the TCAD model include, but are not limited to the physical structure of the device, dopant type(s), dopant concentration(s) and the DOS. Further, process P120 may include fine tuning model parameters such as trap physics, self-heating models, emission and absorption rate coefficients at the traps, mobility models etc., to obtain a good match between the TCAD and the observed resistance and temperature coefficient of resistance. The resistance and TCR may be extracted from a single voltage sweep which includes a high enough voltage to induce self-heating in the resistor, or from multiple low voltage sweeps at multiple temperatures. The TCAD model is used to supply simulated temperature, as shown in FIG. 3B, discussed below. Thus, the TCR may be determined by either of the two methods. First, by resistance measurements at few temperature points, second, by employing the TCAD model. Once the TCR is so determined the next step of modifying the grain sizes using grain size modulating species may be employed to fine tune the process towards the desired/targeted TCR. As discussed above, the TCR may be measured either via the novel TCAD method (as described herein) or via a plurality of experiments, although the TCAD method may be more feasible in terms of time and resources required. TCR values obtained by performing a first of the two methods may be validated by performing the second method to re-obtain those TCR values. The electro-thermal impact of using a different combination of GSMS dose level and composition may be determined by several "what if" scenarios using the TCAD model, e.g. if the TCR has not reached its target, then polysilicon grain size may be changed in a TCAD model and if TCR is calculated to be closer to the target, then the new grain size may be used in a fabricated wafer. I.e., in this example, once the new grain size is determined, then a new GSMS dose may be determined. The GSMS dose level may include a concentration of the GSMS and a composition of the GSMS.

FIG. 2A illustrates resistance versus voltage curves interpolated from measured current vs. voltage data. The illustrated data was taken from polysilicon resistors using ten different voltages at four different sites on a single wafer. Illustrative resistance vs. voltage curves are shown in FIG. 3A and are discussed above. Converting a current vs. voltage to a resistance vs. voltage curve may be performed using Ohm's law and no special equipment should be necessary to make such calculations, however such calculations may be performed using a computing device with an appropriate processor and appropriate programming. One curve showing simulated data from a TCAD model created from inputted parameters related to the physical wafer is also shown. As can be seen in FIG. 3A, the simulated data tracks well with the measured data and its interpolated curves.

Continuing with the method illustrated in FIG. 1, P130 includes calculating a resistance versus voltage characteristic based on a measured current versus voltage characteristic for the polysilicon resistor and P140 includes converting the resistance versus voltage characteristic to a resistance versus temperature characteristic using the TCAD simulation model. The TCAD model is used to simulate a temperature vs. normalized resistance curve, as illustrated in FIG. 3B as discussed above.

Figure 4:
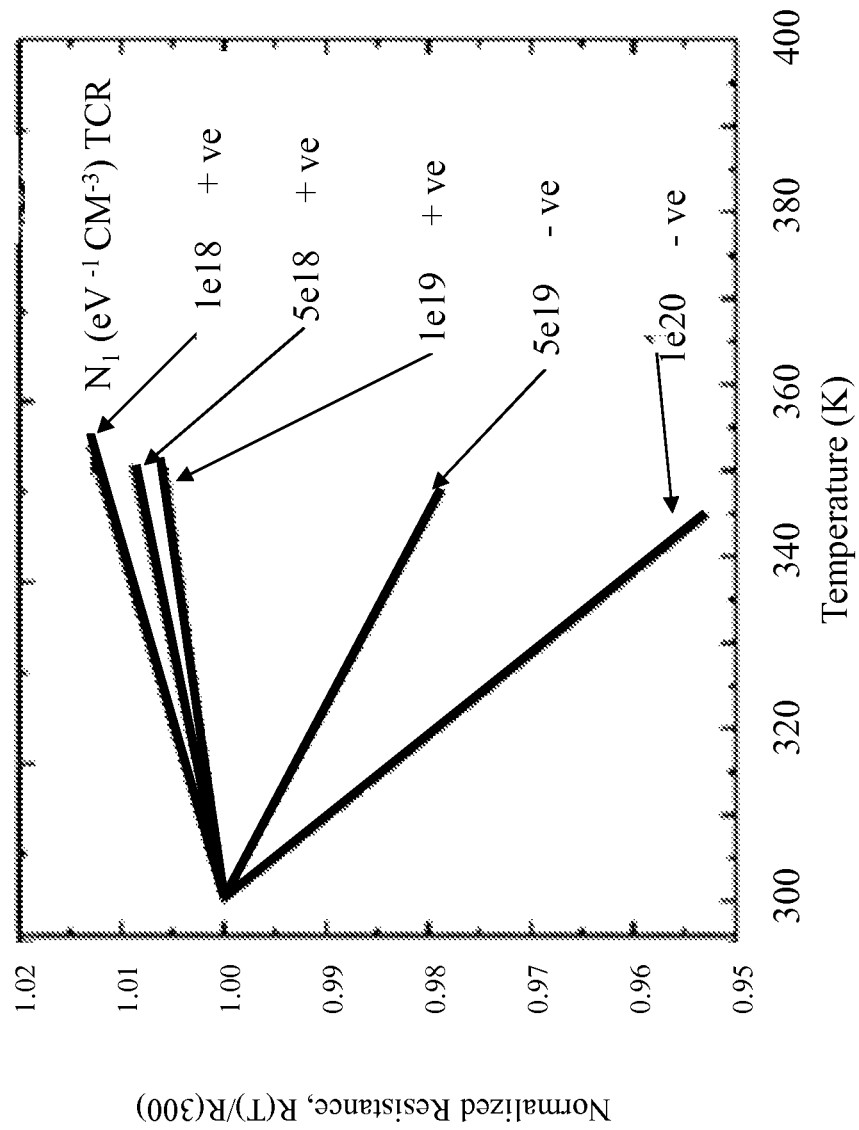
FIG. 4 shows a graph illustrating data according to embodiments.

Moving on, process P150 includes calculating the TCR for the polysilicon resistor using the resistance versus temperature characteristic. Process P150 may be performed, for example by reading the simulated temperature of the device for any given voltage bias and calculating the slope of a resulting resistance vs. temperature plot. Process P150 is performed using the TCAD simulation model discussed above, and an illustrative TCR curve is shown in FIG. 3B. The TCR is a coefficient that relates temperature to resistance for a given polysilicon resistor. According to aspects, calculating the TCR may be performed either by adopting the above novel TCAD method or by a plurality of experiments. FIG. 4 illustrates five illustrative curves for five different resistors having five different TCRs. Three of the illustrated TCRs are positive and two are negative. The illustrated TCR curves each correspond to a polysilicon grain size and therefore to a specific trap density state for a given polysilicon grain size distribution Note that the curves are linear over the temperature ranges shown. It should be further noted that the displayed resistances are normalized to a value of 1. That is, in this illustrative example, the data has been normalized with the room temperature resistance of each of the resistors for a proper comparison of the slopes and highlighting the changing TCR with polysilicon grain size. The resistance of these resistors changes as operating temperature changes, as discussed above. While not shown in FIG. 4, it is possible to have a TCR of zero, in which case, the resistance would remain at the normalized value of 1 as temperature changes. Such a zero TCR resistor or a combination of resistors with selected TCRs allows for fabrication of devices having temperature-independent electrical behavior.

Referring back to FIG. 1, FIG. 1 illustrates process P160 which includes determining whether the calculated TCR complies with a target TCR. If the calculated TCR complies with a target TCR, then process P160 may be a stopping point according to embodiments. However, if the calculated TCR does not comply with a target TCR, the further processes may be performed as illustrated. Process P170 may be performed in response to the calculated TCR not complying with the target TCR. Process P170 includes forming of the polysilicon resistor using an adjusted dose of the grain size modulating species (GSMS) different from the selected dose. It should be understood that a dose of the grain size modulating species includes a concentration and composition of the grain size modulating species In performing process P170, the resistance vs. temperature characteristic may serve as a reference. Also the information gained in process P150 may be added to a growing database of such information. Adjusting the dose of the grain size modulating species (GSMS) is understood to mean that dose of the GSMS is adjusted relative to the selected dose of the GSMS. According to some embodiments, the selected doping level may include an average polysilicon grain size, while the adjusted dose of the GSMS may result in a greater average polysilicon grain size than the polysilicon grain size of the selected dose level of the GSMS. Alternatively, the adjusted dose level of the GSMS may include a lesser average concentration and composition of the GSMS, than the grain size of the selected GSMS dose level. Also according to embodiments, the greater average polysilicon grain size and/or the lesser average polysilicon grain size may be estimated using the TCAD simulation model, furthermore, TCAD may be used to simulate any of several other materials and electrical parameters and properties. After performing optional process P170, processes P110, P120, P130, P140 and P150 may be repeated, as illustrated in FIG. 1. This loop may be reiterated until the TCR calculated in process P150 complies with a target TCR as discussed above with respect to FIG. 1. Also after performing process P170, data such as polysilicon grain size and TCR may be added to the database discussed above with respect to process P150.

Figure 2:
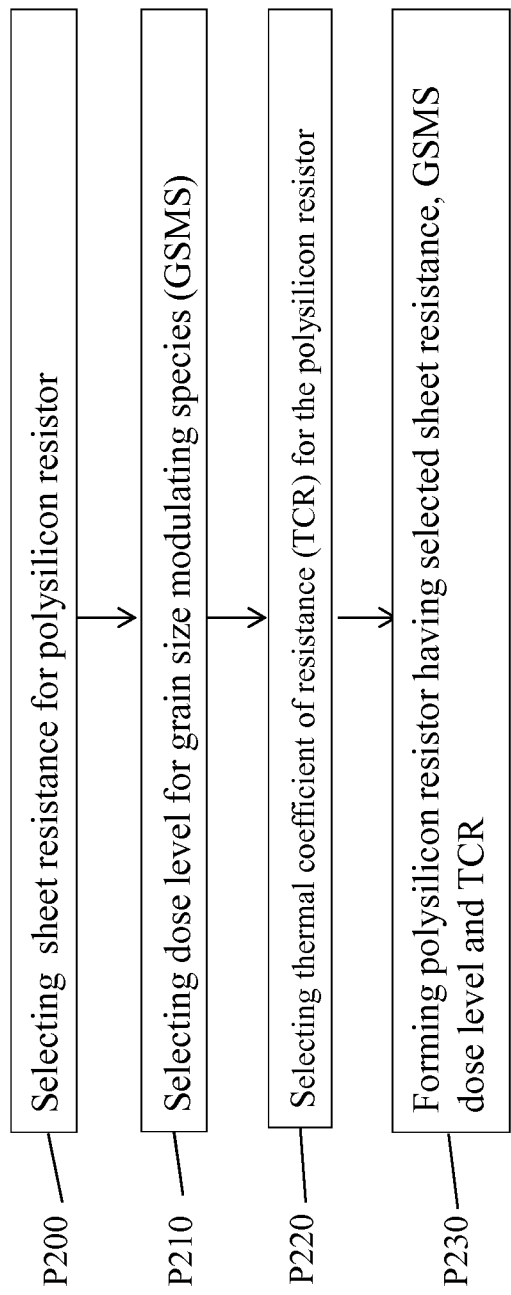
FIG. 2 shows a flow diagram illustrating a method according to various embodiments.
Figure 3A:
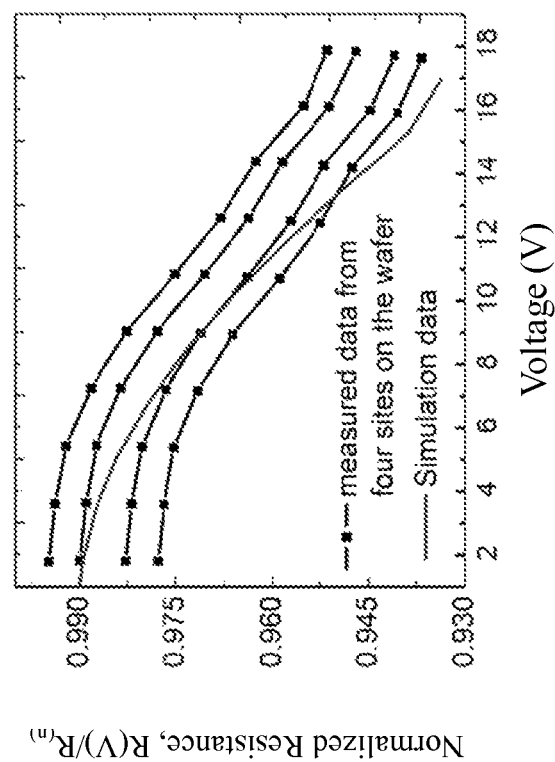
FIG. 3A shows a graph illustrating measured and simulated data according to embodiments.

FIG. 2 illustrates a flow diagram is shown illustrating processes that may be performed in a method according to various embodiments. FIG. 2 illustrates a method of manufacturing a polysilicon resistor with a selected temperature coefficient of resistance (TCR). Process P200 includes selecting a sheet resistance for the polysilicon resistor, the selected sheet resistance being related to a selected film thickness of the polysilicon resistor. As discussed above with respect to process P100, the polysilicon resistor may be manufactured or acquired with the selected sheet resistance. Process P210 includes selecting a dose level for a grain size modulating species (GSMS) for modulating an average grain size of grains of the polysilicon resistor. Process P220 includes selecting a thermal coefficient of resistance (TCR) for the polysilicon resistor, the TCR being related to a selected average grain size of the polysilicon and process P240 includes forming the polysilicon resistor on a substrate, the polysilicon resistor having the selected sheet resistance, the selected GSMS dose level and the selected TCR. The order of performing processes P200, P210 and P220 may not be important. I.e., process P220 may be performed before or after either of processes P200 and P210. The order of processes P200, P210 and P220 is illustrated in such an order only for the sake of explanation. Also, the selection of sheet resistance, the GSMS dose level and the selection of TCR are described above with respect to processes P100-P170 and will not be repeated for the sake of brevity.

Embodiments may include creating a look-up table by recording, in a database, each calculated TCR along with their associated GSMS dose level. The look up table may be useful for future creation of polysilicon resistors. That is, the look up table may be used to avoid repeating some or all of the iterative steps described above because the grain size used in a first resistor may be appropriate for a target TCR. The dose level recorded in the look up table may include a concentration of the GSMS and a composition of the GSMS.

Figure 5:
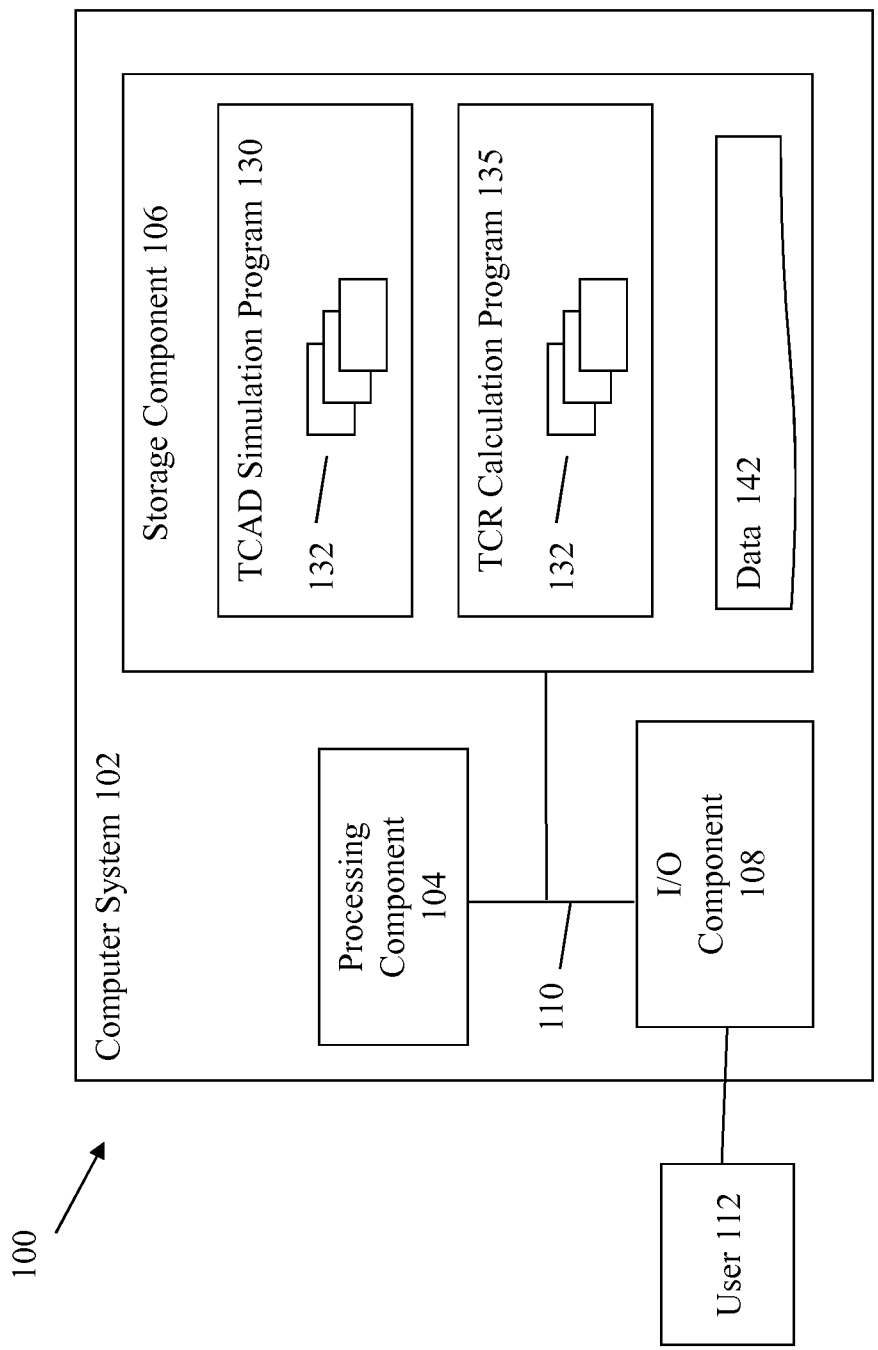
FIG. 5 shows an illustrative environment according to various embodiments.

Turning now to FIG. 5, an illustrative environment according to various embodiments is shown. FIG. 5 depicts an illustrative environment 100 for providing a computer system for calculating a temperature coefficient of resistance (TCR) for a polysilicon resistor. To this extent, the environment 100 includes a computer system 102 that can perform a process described herein in order to calculate a TCR for a polysilicon resistor. In particular, the computer system 102 is shown as including a TCAD simulation program 130 and a TCR calculation program 135, which make computer system 102 operable to handle all necessary calculations and functions by performing any/all of the processes described herein and implementing any/all of the embodiments described herein. While TCAD simulation program 130 and TCR calculation program are illustrated within storage component 106, it should be understood that programs 130 and 135 may be stored separately on different storage components, and that parts of each program may be stored on different storage components.

Computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as TCAD simulation program 130 or TCR calculation program 135, both of which maybe at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human-directed, or non-human-directed I/O devices, which enable a user 112 to interact with the computer system 102 and/or one or more communications devices to enable a system user 112 to communicate with the computer system 102 using any type of communications link. User 112 may be a human, including a technician, or a non-human system. Both TCAD simulation program 130 and TCR calculation program 135 can manage a set of interfaces (e.g., graphical user interface(s), application program interface, etc.) that enable human and/or system users 112 to interact with TCAD simulation program 130 and TCR calculation program 135. Further, the TCAD simulation program 130 and TCR calculation program 135 can each manage (e.g., store, retrieve, create, manipulate, organize, present, etc.) data, such as data 142, etc., using any solution.

In any event, computer system 102 can comprise one or more general purpose computing articles of manufacture (e.g., computing devices) capable of executing program code, such as TCAD simulation program 130 and TCR calculation program 135, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, TCAD simulation program 130 and TCR calculation program 135 can be embodied as any combination of system software and/or application software.

Further, the TCAD simulation program 130 and TCR calculation program 135 can be implemented using a set of modules 132. In this case, a module 132 can enable the computer system 102 to perform a set of tasks used by TCAD simulation program 130 and TCR calculation program 135, and can be separately developed and/or implemented apart from other portions of TCAD simulation program 130 and TCR calculation program 135. As used herein, with reference to the computer system hardware, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of TCAD simulation program 130 and TCR calculation program 135 fixed thereon (e.g., one or more modules 132). However, it is understood that the computer system 102 and TCAD simulation program 130 and TCR calculation program 135 are only representative of various possible equivalent computer systems that may perform a process described herein. To this extent, in other embodiments, the functionality provided by computer system 102 and TCAD simulation program 130 and TCR calculation program 135 can be at least partially implemented by one or more computing devices that include any combination of general and/or specific purpose hardware with or without program code. In each embodiment, the hardware and program code, if included, can be created using standard engineering and programming techniques, respectively.

When computer system 102 includes multiple computing devices, the computing devices can communicate over any type of communications link. Further, while performing a process described herein, computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

Computer system 102 can obtain or provide data, such as data 142 using any solution. For example, computer system 102 can generate and/or be used to generate data 142, retrieve data 142, from one or more data stores, receive data 142, from another system, send data 142 to another system, etc.

While shown and described herein as methods for calculating a TCR for a polysilicon resistor, it is understood that aspects of the invention further provide various alternative embodiments. For example, in one embodiment, the invention provides a computer program fixed in at least one computer-readable medium, which when executed, enables a computer system to perform a method of calculating a TCR for a polysilicon resistor. To this extent, the computer-readable medium includes program code, such as TCAD simulation program 130 and TCR calculation program 135, which implement some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of calculating a TCR for a polysilicon resistor. In this case, a computer system, such as computer system 102 (FIG. 5), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

It is understood that aspects of the invention can be implemented as part of a business method that performs a process described herein on a subscription, advertising, and/or fee basis. That is, a service provider could offer to characterize an optical mask as described herein. In this case, the service provider can manage (e.g., create, maintain, support, etc.) a computer system, such as computer system 102 (FIG. 5), that performs a process described herein for one or more customers. In return, the service provider can receive payment from the customer(s) under a subscription and/or fee agreement, receive payment from the sale of advertising to one or more third parties, and/or the like.

Figure 6:
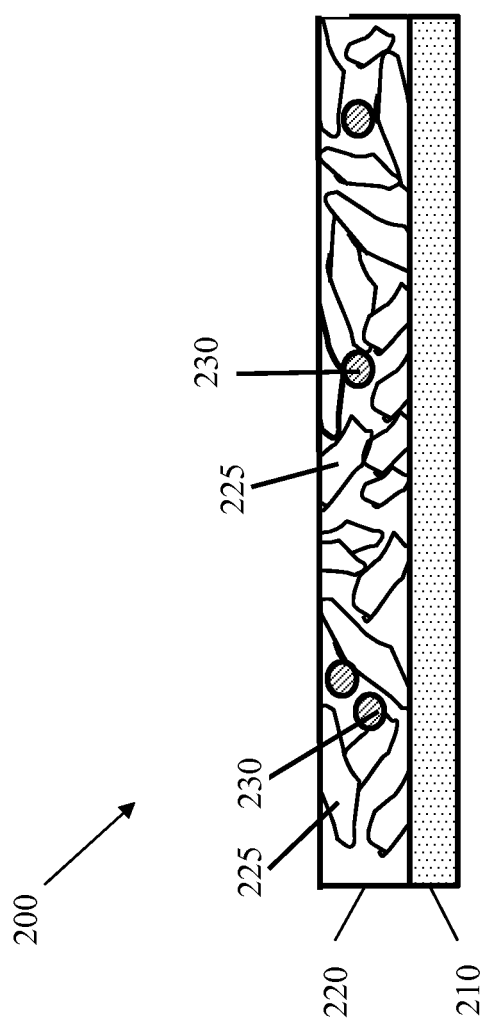
FIG. 6 shows an illustrative polysilicon resistor structure according to various embodiments.

Turning now to FIG. 6, an illustrative polysilicon resistor structure 200 according to various embodiments is shown. Polysilicon resistor structure 200 is shown having substrate 210 and polysilicon resistor body 220. Polysilicon resistor body includes polysilicon grains 225 and grain size modulating species (GSMS) 230 interspersed between polysilicon grains 225. Substrate 210 may be chosen from any appropriate material including, but not limited to silicon oxide, another insulating material or any other appropriate material or materials for given purpose. Polysilicon grains 225 and GSMS 230 are discussed herein above and descriptions of grains 225 and GSMS 230 will not be repeated for the sake of brevity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of manufacturing a polysilicon resistor with a selected temperature coefficient of resistance (TCR), the method comprising:
    selecting a sheet resistance for the polysilicon resistor, the selected sheet resistance being related to a selected film thickness of the polysilicon resistor;
    selecting a dose level for a grain size modulating species (GSMS) for modulating an average grain size of grains of the polysilicon resistor;
    creating a look-up table including a plurality of TCR values associated with a corresponding GSMS dose level;
    selecting the TCR for the polysilicon resistor, the TCR being related to a selected average grain size of the polysilicon, wherein the selecting of the TCR for the polysilicon resistor includes selecting the TCR from the look-up table after the creating of the look-up table; and
    forming the polysilicon resistor on a substrate, the polysilicon resistor having the selected sheet resistance, the selected GSMS dose level and the selected TCR.

2. The method of claim 1, wherein the selecting of the dose level for the GSMS is performed after the selecting of the sheet resistance for the polysilicon resistor.

3. The method of claim 1, wherein the selecting of the TCR for the polysilicon resistor is performed after the selecting of the dose level for the GSMS.

4. The method of claim 1, wherein the forming of the polysilicon resistor on the substrate is performed after the selecting of the TCR for the polysilicon resistor.

5. The method of claim 1, wherein the GSMS dose level includes a concentration of the GSMS and a composition of the GSMS for each corresponding GSMS dose level.

* * * * *